United States Patent [19]
Angelopoulos et al.

[11] Patent Number: 5,202,061
[45] Date of Patent: Apr. 13, 1993

[54] ELECTRICALLY CONDUCTIVE POLYMERIC MATERIALS AND USES THEREOF

[75] Inventors: Marie Angelopoulos, Briarcliff Manor; Wu-Song Huang, Poughkeepsie; Richard D. Kaplan, Wappingers Falls, all of N.Y.; Marie-Annick Le Corre, St Fargeau Ponthierry, France; Stanley E. Perreault, Wappingers Falls, N.Y.; Jane M. Shaw, Ridgefield, Conn.; Michel R. Tissier, Noisy sur Ecole, France; George F. Walker, New York, N.Y.

[73] Assignee: International Business Machines Corporation, Armonk, N.Y.

[21] Appl. No.: 717,968

[22] Filed: Jun. 20, 1991

Related U.S. Application Data

[62] Division of Ser. No. 357,565, May 26, 1989.

[51] Int. Cl.$^5$ .............................................. A01B 5/14
[52] U.S. Cl. ................................................. 252/500
[58] Field of Search ................. 252/500, 518; 428/246, 428/327, 901

[56] References Cited

U.S. PATENT DOCUMENTS 4,804,594  2/1989  Jow et al. ............................. 429/194
4,962,158  10/1990  Kobayashi ........................... 252/500
4,963,206  10/1990  Shacklette et al. .................... 156/99

Primary Examiner—Mark L. Bell
Assistant Examiner—Alan Wright
Attorney, Agent, or Firm—Daniel P. Morris

[57] ABSTRACT

Structures containing conducting polymers and methods of fabrication thereof. Electrical conductivity can be induced in polymers selected from the group of substituted and unsubstituted polyanilines, polyparaphenylenvinyles, substituted and unsubstituted polythiophenes substituted and unsubstituted poly-p-phenylene sulfides, substituted polyfuranes, substituted polypyrroles, substituted polyselenophene, polyacetylines formed from soluble precursors, combinations thereof and blends thereof with other polymers. The polymer contains a doping precursor, selected from the group of onium salts, iodonium salts, triflate salts, borate salts and tosylate salts and sulfonoxylimides. Conductivity can be selectively induced in the polymer by selectively doping upon selective exposure to a source of energy such as electromagnetic radiation, an electron beam and heat. The electrically conductive polymers of the present invention are useful as electron discharge layers for electron beam applications, such as, SEM observations, as electromagnetic interference coatings on dielectric surfaces and as electron beam resist which acts as a discharge layer.

9 Claims, 6 Drawing Sheets

ELECTRICALLY CONDUCTIVE POLYMERIC MATERIALS AND USES THEREOF

This is a division of application Ser. No. 07/357,565, filed May 26, 1989.

FIELD OF THE INVENTION

This invention relates to electrically conductive polymers, electrically conductive resists, uses thereof and structures fabricated therewith. More particularly, this invention relates to electrically conductive substituted and unsubstituted polyanilines, substituted polyparaphenylenevinylenes, substituted and unsubstitued polythiophenes, polyazines, substituted polyfuranes, substituted polpyrroles, substituted polyselenophene, substituted and unsubstituted poly-p-phenylene sulfides and polyacetylenes formed from soluble precursors and to selectively forming conducting patterns in these materials and the use of these materials as an electrical discharge layer.

BACKGROUND OF THE INVENTION

Electrically conducting organic polymers have been of scientific and technological interest since the last 1970's. These relatively new materials exhibit the electronic and magnetic properties characteristic of metals while retaining the physical and mechanical properties associated with conventional organic polymers. Technological application of these polymers are beginning to emerge. Herein we describe electrically conducting polyparaphenylenevinylenes, polyanilines, polythiophenes, polyfuranes, polypyrroles, polyselenophene, poly-p-phenylene sulfides, polyacetylenes formed from soluble precursors, combinations thereof and blends thereof with other polymers.

Selected regions of films of the materials of the present invention can be made conducting upon the selective exposure to a source of energy. These materials can be used to make a patternable conductive resist material and can be used as an electrostatic discharge layer, or as an electromagnetic interference (EMI) layer on the surface of a substrate. Because of the electrostatic properties of these materials they can be used as an electron beam resist which acts as its own discharge layer. Moreover, since the materials of the present invention can be readily removed from a surface on which they are deposited, they can be used as a removable electrostatic discharge layer disposed on a dielectric surface under electron beam microscopic examination, for example in a scanning electron microscope (SEM). A removable electrostatic discharge layer permits SEM analysis without destroying the sample.

The article entitled "Photoinitiated Doping of Polyacetylene", T. Clarke et al., J.C.P. Chem Comm., 1981, p. 384, describes insoluble polyacetylene selectively doped with proton acids. The polyacetylene is impregnated with one of the group of triarylsulfonium and diaryliodonium which are innert to the polyacetylene but which on irradiation with a uv light undergo a photochemical reaction leading to the doping of the polyacetylene to make it conductive. The impregnated film can be selectively exposed to light through a mask to selectively dope selected regions of the polymer. Polyacetylene is not suitable, as a resist material as are the materials of the present invention, since the polyacetylene is not soluble. For a polymer to be suitable as a resist material it must be capable of having a preselected pattern formed therein, for example on exposure to radiation, with either the exposed or unexposed region being soluble in a solvent while the other of the exposed or unexposed region is insoluble in the solvent.

The article entitled "Photochemically Doped Polypyrrole" of S. Pitchumani et al., J. Chem. Soc., Chem. Commun., 1983, p. 809, describes photochemically doped polypyrrole using as photochemical dopant diphenyliodoniumhexafluoroarsenate. Doping was accomplished by immersion of the polypyrrole substrate in a solution containing the photochemical dopant in methylene dichloride followed by irradiation with a mercury arc. Polypyrrole is not suitable for a photoresist material since the polypyrrole is insoluble.

In both the article of Clarke et al. and the article of Pitchumani et al. an insoluble solid polymer is immersed in a solution containing a dopant material. The dopant material and the solvent are absorbed into the surface of the material. In both cases the solvent in combination with the dopant is exposed to light to render the irradiated part of the polymer electrically conducting. Because of the non-soluble nature of the polymers, the dopants can only be impregnated or absorbed into the surface of the polymer film.

The articles entitled "Polyaniline; Processability From Aqueous Solutions and Effective Water Vapor on Conductivity" to M. Angelopoulous et al., Synthetic Metals, 21 (1987) pp. 21-30, and the article entitled "Polyaniline: Solutions, Films, and Oxidation Stte" to M. Angelopoulous et al., Mol. Cryst. Liq. Cryst 160-151 (1988), describe a chemically synthesized emeraldine base form of polyaniline which is soluble in various solvents. The emeraldine base is doped by reacting, the emeraldine powder or film with aqueous acid solution for several hours, for example, aqueous acetic acid or aqueous HCl. In contradistinction, according to the present invention where conductive polymeric materials are used as a resist material the dopant reagent and polymer are mixed in a solvent which is thereafter dried to remove the solvents to form a solid solution of the dopant reagent and the polymer. The solid solution is then selectively exposed to energy, for example, electromagnetic radiation, heat or an electron beam, which causes the reagent to decompose to dope these regions of the polymer which are exposed to the energy forming a conductive polymer in exposed regions. In the exposed region the polymer is rendered insoluble and in the unexposed regions the polymer is soluble and can thereby be removed to act as a negative photoresist which is selectively electrically conducting. A resist material of this kind is particularly useful for electron beam lithographic applications since the resist material can be its own discharge layer.

One problem associated with electron beam lithography is charging of the electron beam resist. This is particularly significant in microelectronic applications. In microelectronic applications, a pattern in a dielectric layer or an electrically conducting layer, can be formed by depositing a resist material thereover. A commonly used method of selectively removing the resist material is to selectively expose the resist material to an electron beam. The resist material in the exposed region is either made soluble or insoluble upon exposure to the electron beam radiation. The solubility of the unexposed region is opposite that of the exposed region. Therefore, the exposed or the unexposed region can be removed. The resist material is typically a dielectric. When an electron beam is directed at a dielectric surface, charges from the electron beam accumulate on the surface creating an electric filed which distorts the electron beam on the surface resulting in a loss of precision and displacement errors. To avoid charging the resist, it is common practice in the art to coat the resist, prior to electron beam exposure, with a thin conducting metal layer. Most metals, e.g. Au and Pd, are difficult to remove. In some cases the metal deposition process can degrade the lithographic properties of the resist due to heat and stray radiation during deposition. The polymer discharge layers of the present invention can be deposited by a simple spin coat process, whereas a metal cannot.

According to one aspect of the present invention, a resist material is provided which is on selective exposure to energy, for example electromagnetic radiation, an electron beam or heat, rendered insoluble and at the same time electrically conducting. The exposed regions are insoluble and conducting and the unexposed regions are soluble and nonconducting. When the source of energy generating the pattern is an electron beam, the pattern which is conducting forms an electron discharge path preventing distortion of the writing beam. If the dielectric layer on which the resist is deposited is thin, the discharge path does not have to be grounded. This avoids the requirement of depositing a metal layer to act as a discharge layer.

The polymer materials which are made electrically conductive according to the present invention have additional utility in providing an easily processable and low cost EMI (electromagnetic interference) layer which can provide shielding of electrical components from electrical noise.

The conductive polymer materials of the present invention can also be used as an electrical discharge layer for scanning electron microscopic applications. Typically, when a sample is being analyzed under a scanning electron microscope a thin metal layer is coated onto the sample. A commonly used metal layer is gold or a mixture of gold with other metals. This thin metallic layer acts as an electrical discharge layer to prevent the accumulation of electrical charge on the surface of the sample being examined. When a metallic material is used as an electrical discharge layer it cannot be easily removed, therefore, the sample being examined must be discarded. This is particularly costly in microelectronic applications where it may be desirable to examine a semiconductor chip or semiconductor chip packaging substrate with an electron microscope where the chip or substrate is functional and useful. Depositing a thin metallic layer onto a substrate would render the chip or substrate not usable. By using the electrically conducting polymeric materials according to the present invention, a functional sample can be coated with the polymer, subjected to examination under an electron microscope and thereafter the electrically conductive polymer can be easily removed permitting electron microscopic examination of the functioning part and permitting it to be subsequently used.

It is an object of this invention to provide an electron beam resist material which functions as an electrical discharge layer.

It is another object of this invention to provide a resist material whose solubility and conductivity are dependent upon a dopant species generated by exposure of a dopant precursor to energy.

It is another object of this invention, to provide a method of forming a solid solution of a polymer which is selectively transformed to the conducting state by being selectively exposed to a source of energy.

It is another object of this invention to provide a conductive polymeric electromagnetic interference layer.

It is another object of this invention, to provide an electrical discharge layer for substrates exposed to electron beam radiation, wherein the discharge layer is removable.

SUMMARY OF THE INVENTION

A broad aspect of this invention is a polymeric material which has selected regions which are electrically conductive and insoluble and wherein non-electrically conductive regions are soluble.

In a more particular aspect of the present invention, the polymeric material has a partially conjugated $\pi$ system which is extended by the addition of dopants to the polymeric material to provide at least enough $\pi$ conjugation so that the $\pi$ conjugated parts of a molecule of the polymer are substantially in contact with the $\pi$ conjugated parts of an adjacent molecule.

In another more particular aspect of the present invention, the polymer is selected from substituted polyparaphenylenvinyles, substituted or unsubstituted polyanilines, substituted polythiophenes, polyazines, substituted or unsubstituted poly-p-phenylene sulfides, substituted polypyrroles, substituted polyselenophene, polyacetylenes formed from soluble procursors, combinations thereof and blends thereof with other polymers.

In another more particular aspect of the present invention, a reagent containing a doping species is contained within the polymer matrix. The doping species is capable of dissociating upon the application of energy, such as electromagnetic radiation, an electron beam and heat. The dissociated species dopes the polymer making it electrically conductive.

In another more particular aspect of the present invention, the dopant species is selected from the group of onium salts, iodonium salts, borate salts, tosylate salts, triflate salts and sulfonyloxyimides.

Another more particular aspect of the present invention, is a method of writing and developing a negative image in a polymer wherein the undeveloped portions of the polymer are electrically conducting.

In another more particular aspect of a method according to the present invention, a solution is formed from a polymer having an extended $\pi$ conjugated system with a doping species and a solvent. The solution is deposited onto the surface of a substrate, dried to remove the solvent leaving a solid solution of the polymer and the doping species on the surface. The solid solution is selectively exposed to energy, for example, electromagnetic radiation, electron beam radiation or heat, to render the selectively exposed regions electrically conductive. The unexposed regions are thereafter removed in a solvent leaving a pattern of an electrically conductive polymer.

In another more particular aspect of the present invention, a substrate is coated with the electrically conductive polymers according to the present invention, wherein the electrically conductive polymer coating acts as an electrical discharge layer.

In another more particular aspect of the present invention, the polymers with the dopant therein according to the present invention are disposed on the surface of a sample for electron beam microscope examination to function as an electrical discharge layer eliminating distortion from accumulated charge on the electron beam irradiated surface.

These and other objects, features and advantages will be apparent from the following more particular description of the preferred embodiments and the figures appended thereto.

DETAILED DESCRIPTION OF THE PREFERRED EMBODIMENTS

Figure 1:
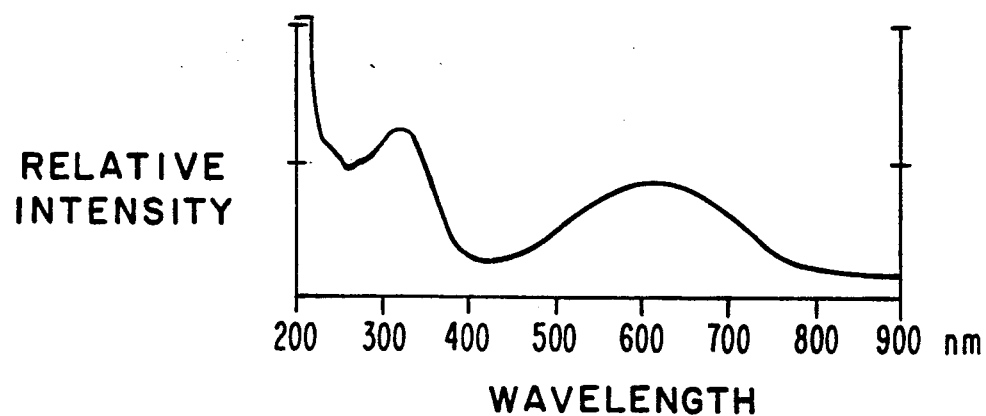
FIG. 1 is a UV/visible spectra of the emeraldine base form of polyaniline.

One embodiment of the present invention is a polymer material which can be used a a negative resist material. The polymer is disposed onto a substrate and selectively exposed to a source of energy. The energy renders the exposed regions insoluble as compared to the unexposed regions and the exposed regions are rendered electrically conductive. These materials are useful as negative resists for microelectronic applications, such as patterning a dielectric or metal layer on the surface of a semiconductive chip or semiconductor chip package substrate. The use of these materials as resist material has particularly utility in electron beam lithography.

Resist materials are generally polymers which are dielectrics. If an electron beam is used to write a pattern in a dielectric resist material, electrons can accumulate on the surface of the dielectric resist. The electrons create an electric field which results in distortion of the electron beam which is writing the pattern. State of the art electron beam lithography uses electron beams having a cross-sectional size in the order of a micron and less. It does not take much locally accumulated charge to create a distortion in such a small cross-sectional beam. To avoid this problem it is common practice to the art to deposit over a resist material a thin layer of metal. We have discovered a way of avoiding depositing a thin layer of metal onto a resist material to avoid the charging problem. The polymers of the present invention can be used as a direct substitute for the metal layer. The polymer is deposited onto the surface of the electron beam resist and exposed to a source of energy to render it conducting. The conducting polymers act as a discharge layer.

The polymers used to fabricate the resist materials of the present invention contain a partially conjugated $\pi$ system. A solution is formed of the polymer. To the solution is added a doping species (dopant precursor) which on exposure to energy generates a dopant which dopes the polymer to the conducting state. The addition of the dopant results in an expansion of the extent of the conjugated $\pi$ system in the individual polymer molecule. It is not necessary to extend the conjugated $\pi$ system over the full extent of the molecule. It is only necessary to sufficiently extend the $\pi$ conjugated system of an individual molecule so that after the solvent is removed the $\pi$ conjugate part of an individual molecule is adjacent to a part of the $\pi$ conjugated part of an adjacent molecule. In the $\pi$ conjugated system an electron is essentially delocalized over the entire $\pi$ conjugated bonds. These electrons are more loosely bond and are available for electrical conduction. When an electric field is applied, an electron can flow along an individual molecule and hop from one molecule to an adjacent molecule in a region where the $\pi$ conjugated parts of the adjacent molecules overlap.

To form a negative resist according to the present invention a $\pi$ conjugated system must be soluble when not exposed to the dopant and insoluble when exposed to the dopant. One possible explanation for the change in solubility upon exposure to the dopant is the following. Dopants can be a cationic species. The dopant transfers positive charges to the $\pi$ conjugated parts of the polymer through protonation, pseudo protonation or oxidation. The polymer now has positive charges on the backbone and then combine with anions to form ion pairs. It is more difficult for a solvent to have enough solvation energy for these ion pairs than for the pristine polymer.

One type of nonconducting polymer useful to practice the present invention is a substituted or unsubstituted polyaniline having the following general formula:

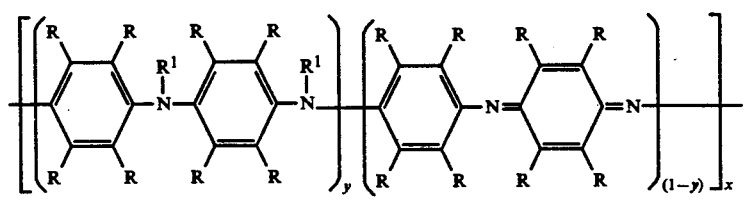

wherein each R can be H or any organic or inorganic radical; each R can be the same or different; wherein each $R^1$ can be H or any organic or inorganic radical, each $R^1$ can be the same or different; $x \geq 1$; preferably $x \geq 2$ and y has a value from 0 to 1. Examples of organic radicals are alkyl or aryl radicals. Examples of inorganic radicals are Si and Ge. This list is exemplary only and not limiting. The most preferred embodiment is emeraldine base form of the polyaniline wherein y has a value of 0.5.

If the polyaniline base is exposed to a cationic species QA, for example a protic acid wherein Q is hydrogen, the nitrogen atoms of the imine part of the polymer become substituted with the Q cation to form an emeraldine salt as shown in the following equation:

organic and inorganic cations, for example, an alkyl group or a metal, being most preferably H.

The emeraldine base form of polyaniline is soluble in various organic solvents and in various aqueous acid solutions. Examples of organic solvents are dimethylsulfoxide (DMSO), dimthylformamide (DMF) and N-methylpyrrolidinone (NMP). This list is exemplary only

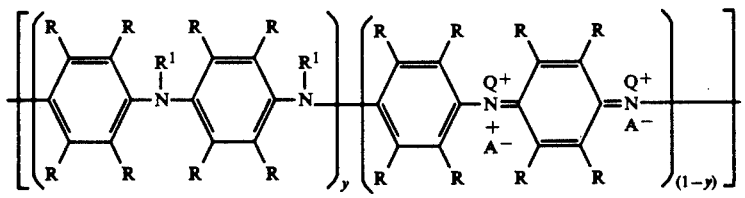

When a protic acid HA is used to dope the polyaniline, the nitrogen atoms of the imine part of the polyaniline are protonated. The emeraldine base form is greatly stabilized by resonance effects as is shown in the following sequence of equations:

and not limiting. Examples of aqueous acid solutions is 80% acetic acid and 60-88% formic acid. This list is exemplary only and not limiting. Substituted polyanilines are soluble in more solvents such as chloroform and methylenechloride.

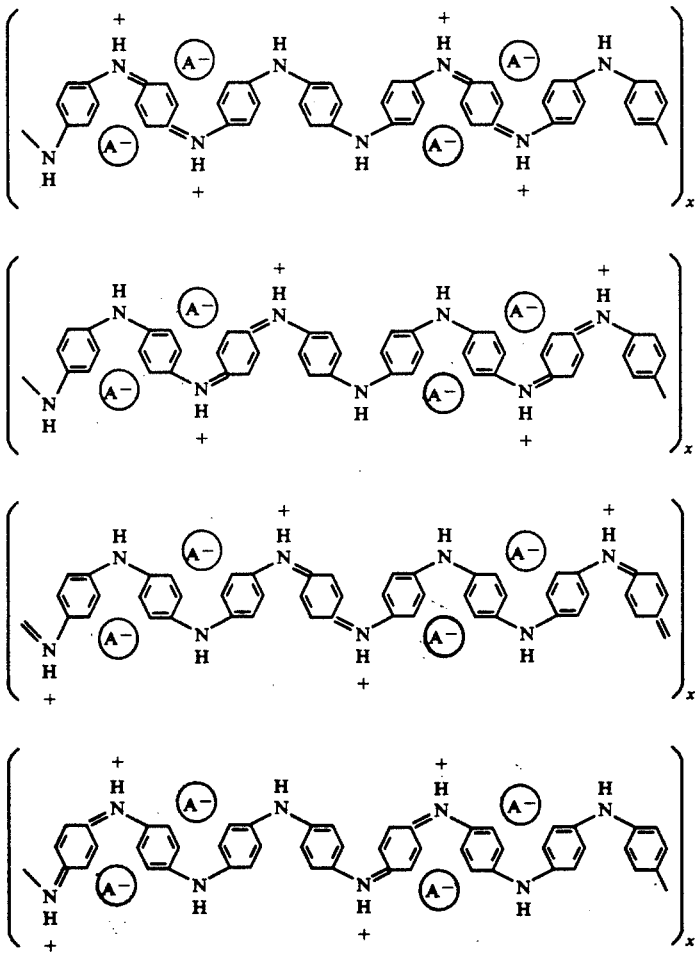

The charges distribute through the nitrogen atoms and aromatic rings making the imine and amine nitrogens indistinguishable. For the sake of simplicity the above sequence of equations was shown with a protonic acid HA. However, a cationic species represented by Q A can also be used whereas Q is a cation selected from A powder of the emeraldine base is mixed in a solvent with a radiation sensitive onium salt. Upon exposure to radiation the onium salt produces free acid which protonates the emeraldine base to yield an emeraldine salt. Anything that generates a cationic species upon electromagnetic or electron beam radiation can dope the polyaniline polymer.

Examples of suitable onium salts include aromatic onium salts of Group IV elements discussed in U.S. Pat. No. 4,175,972, disclosure of which is incorporated herein by reference and aromatic onium salts of Group Va elements discussed in U.S. Pat. No. 4,069,055, disclosure of which is incorporate herein by reference.

Aromatic Group IVa onium salts include those represented by the formula:

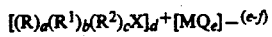

where R is a monovalent aromatic organic radical, $R^1$ is a monovalent organic aliphatic radial selected from alkyl, cycloalkyl and substituted alkyl, $R^2$ is a polyvalent organic radial forming a heterocyclic or fused ring structure selected from aliphatic radicals and aromatic radicals, X is a Group IVa element selected from sulfur, selenium, and tellurium, M is a metal or metalloid, Q is a halogen radical, a is a whole number equal to 0 to 3 inclusive, b is a whole number equal to 0 to 2 inclusive, c is a whole number equal to 0 or 1, where the sum of a+b+c is a value equal to 3 or the valence of X, $d=e-f$ f=valence of M and is an integer equal to from 2 to 7 inclusive, e is >f and is an integer having a value up to 8.

Radicals included by R are, for example, $C_{(6-13)}$ aromatic hydrocarbon radicals such as phenyl, tolyl, naphthyl, anthryl, and such radicals substituted with up to 1 to 4 monovalent radicals such as $C_{(1-8)}$ alkyl such as methyl and ethyl, substituted alkyl such as —$C_2H_4OCH_3$, —$CH_2COOC_2H_5$, —$CH_2COCH_3$, etc. $R^2$ radicals include such structures as:

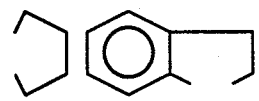

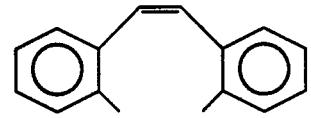

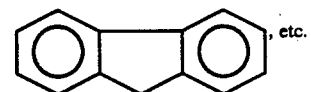

Complex anions included by $MQ_e^{-}(e-f)$ of Formula I are, for example, $BF_4^-$, $PF_6^-$, $SbF_6^-$, $FeCl_6^-$, $SbCl_6^-$, $BiCl_5^-$, $AlF_6^{-3}$, $GaCl_4^-$, $InF_4^-$, $TiF_6^-$, $ZrF_6^-$, etc., where M is a transition metal such as Sb, Fe, Sn, Bi, Al, Ga, In, Ti, Zr, Sc, V, Cr, Mn, Cs, rare earth elements such as the lanthanides, for example, Ce, Pr, Nd, etc., actinides, such as Th, Pa, U, Np, etc. and metalloids such as B, P and As.

Groups IVa onium salts included by Formula I are, for example:

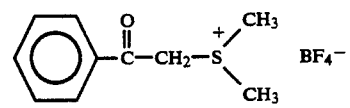

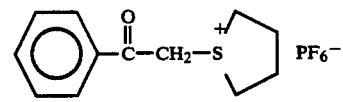

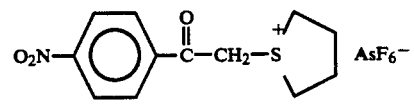

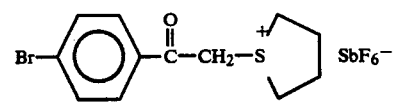

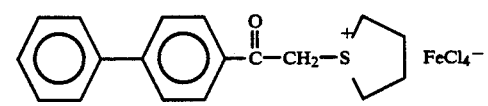

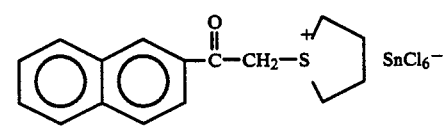

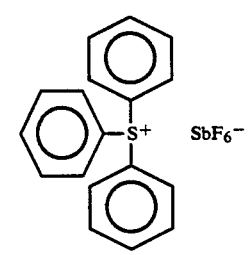

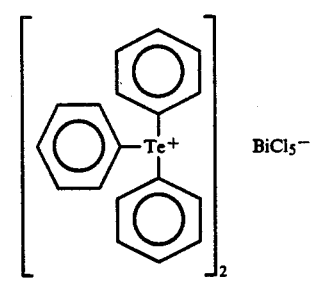

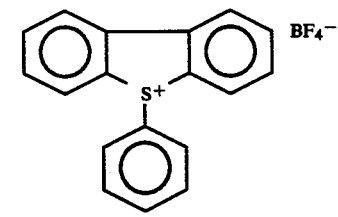

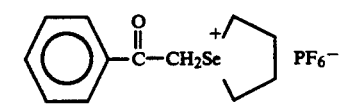

Aromatic group Va onium salts include those represented by the formula:

$$[(R)_a(R^1)_b(R^2)_cX^1]_d^+[MQ_d]^{-(e-f)}$$

where R is a monovalent aromatic organic radical selected from carbocyclic radicals and heterocyclic radicals, $R^1$ is a monovalent organic aliphatic radical selected from alkyl, alkoxy, cycloalkyl and substituted derivatives thereof, $R^2$ is a polyvalent organic radical forming an aromatic heterocyclic or fued ring structure with $X^1$, $X^1$ is a group Va element selected from N, P, As, Sb, and Bi, M is a metal or metalloid, Q is a halogen radical, a is a whole number equal to 0 to 2 inclusive, c is a whole number equal to 0 to 2 inclusive, c is a whole number equal to 0 to 2 inclusive, and the sum of a+b+c is a value equal to 4 of the valence of $X^1$, $$d = e - f$$

f = valence of M is an integer equal to from 2 to 7 inclusive, e is >f and is an integer having a value up to 8.

Radicals included by R are, for example, $C_{(6-13)}$ aromatic hydrocarbon radicals such as phenyl, tolyl, napthyl, anthryl and such radicals substituted with up to 1 to 4 monovalent radicals such as $C_{(1-8)}$ alkoxy, $C_{(1-8)}$ alkyl, nitro, chloro, and hydrocy; arylacyl radicals such as phenylacyl; arylalkyl radicals such as pyridyl and furfuyl; $R^1$ radicals include sub (1-8) alkyl, $C_{(3-8)}$ cycloalkyl, substituted alkyl such as haloalkyl, for example, chloroethyl; alkoxy such as $OCH_2C_6H_5$ and $OCH_3$; alkoxyalkyl such as $-C_2COCH_3$; alkylacyl such as $-CH_2COOC_2H_5$; ketoalkyl such as $-CH_2COCH_3$.

Radicals included by $R^2$ are, for example:

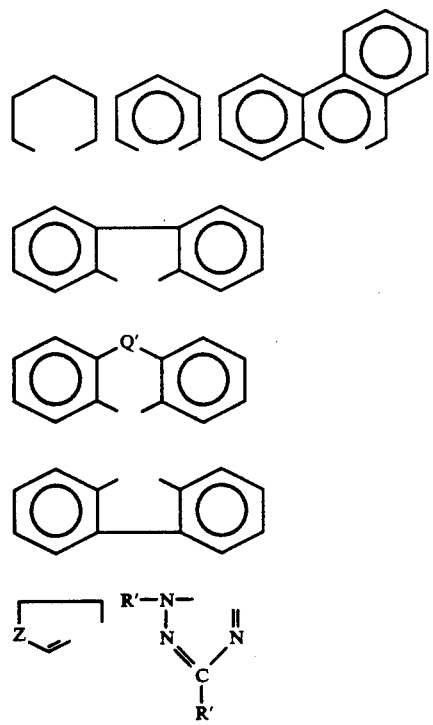

where Q is selected from O, $CH_2$, N, R, and S; Z is selected from —O—, —S— and

and R' is a monovalent radical selected from hydrogen and hydrocarbon. Complex anions included by $MQ_4^{-(e-f)}$ are, for example, $BF_4^-$, $PR_6^-$, $AsF_6^-$, $FeCl_4^=$, $SnCl_6^-$, $SbCl_6^-$, $BiCl_5^-$, where M is more particularly a transition metal such as Sb, Fe, Sn, Bi, Al, Ga, In, Ti, Zr, Sc, V, Cr, Mn and Co; rare earth elements such as the lanthanides, for example, Ce, Pr and Nd; actinides such as Th, Pa, U and Np; and metalloids such as B, P and As.

Anions which are slightly hydrolyzed, e.g. $SbF_5OH^-$—are considered to be the full equivalent if the inhydrolyzed from of the anion for the purposed of the present invention.

EXAMPLE 1

Figure 2:
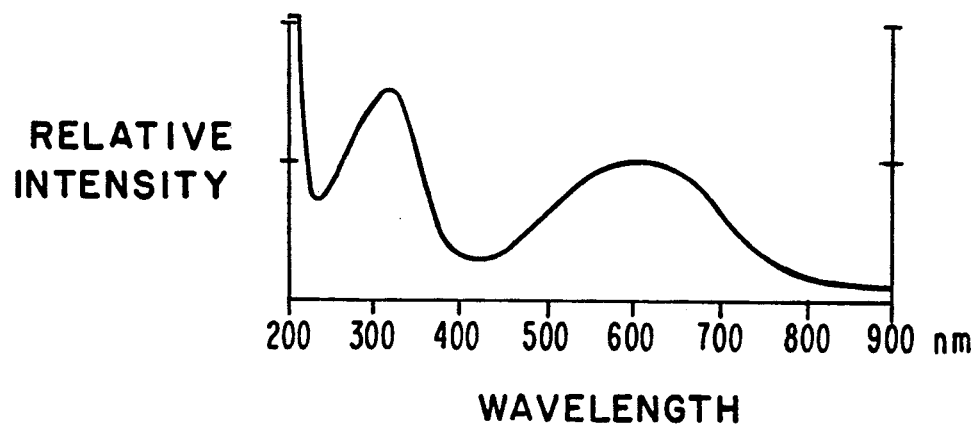
FIG. 2 is the UV/visible spectrum of the emeraldine base form of polyaniline containing an onium salt.
Figure 3:
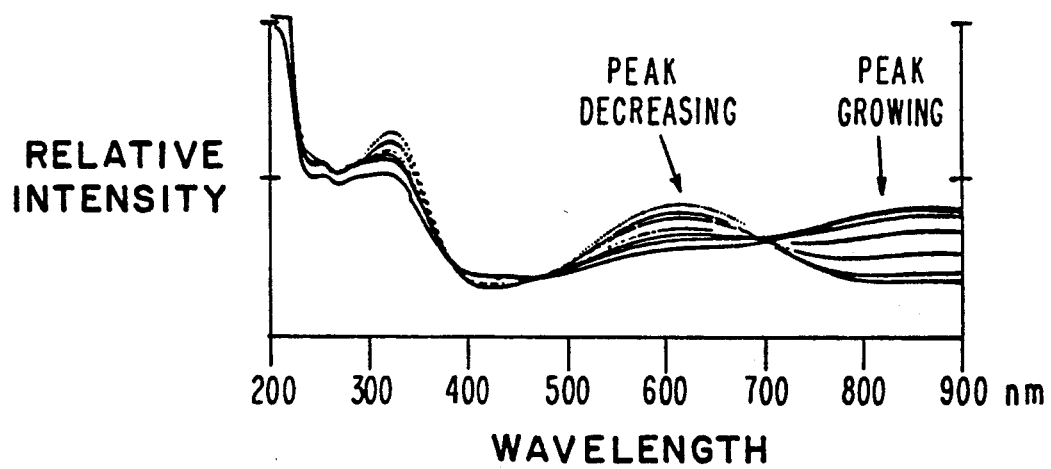
FIG. 3 is the UV/visible spectrum of composition of FIG. 2 after exposure to light at about 240 nm.

To 30 ml of NMP (n-methyl pyrrolidinone) was added 1.5 g of an emeraldine base powder and 9 g of triphenylsulfonium hexafluoroantimonate. The solution was spin-coated onto quartz and silicon wafers to yield a film of approximately 2400 angstroms. FIG. 1 shows a uv/visible spectrum of thin film. The peaks at 320 nm and 610 nm are characteristic of emeraldine base as seen by comparison with the uv/visible spectrum of emeraldine base alone shown in FIG. 2.

The film is dried to remove the solvent. Upon exposure to radiation using a 240 nm filter which was selected for the sensitivity of the onium salt used, the uv/visible spectrum of the emeraldine base film contained the onium salt changes. (It is not necessary to filter the radiation flooding exposure at all wavelengths can be used.) The peaks characteristic of the insulating emeraldine base decrease and there is an appearance of an absorption peak around 850 nm which is characteristic of the conducting emeraldine salt. The conductivity of the exposed film was measured using a four point probe to be approximately 1.6 $ohm^{-1}cm^{-1}$. It will be recognized by those of skill in the art that the conductivity can be controlled by controlling the amount of onium salt added to the polyaniline and by the amount of time to which the polymer and onium salt combination is exposed to the radiation. The polyaniline becomes insoluble upon exposure. In prior art methods, an emeraldine base is mixed in solution with an acid which protonates the emeraldine base insolution. In contradistinction, according to the present invention, an onium salt is mixed with the emeraldine base solution, the onium salt does not protonate the polymer to be conductive at this point. The solution is disposed onto the surface of a substrate and the solvent is removed by heating to result in a solid solution of the polymer with the onium salt embedded therein. The polymer at this point is still not conductive. Only after exposure to electromagnetic radiation, most preferably UV light, or an electron beam does the polymer become conducting.

Figure 4:
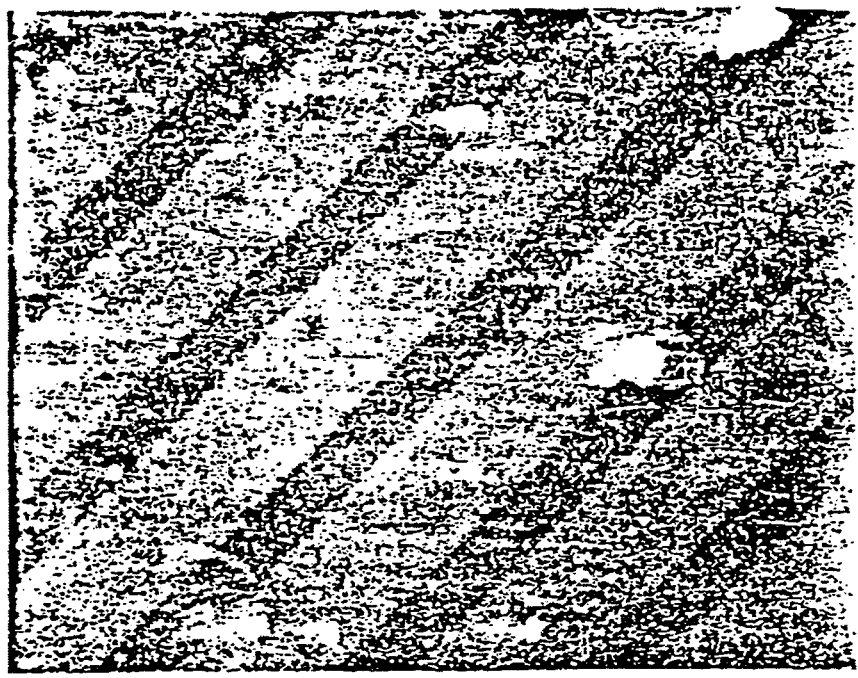
FIG. 4 shows UV light induced conducting lines in an emeraldine base/onium salt polymer of the present invention.

FIG. 4 shows a photograph showing an example of the polyaniline onium salt polymer mixture exposed to radiation through a mask to form conducting lines which appear dark in the figure. There is a color change upon exposure. The nonconducting form is blue and the conducting or exposed form is green. The width of these conducting lines are about 2 microns.

Figure 5:
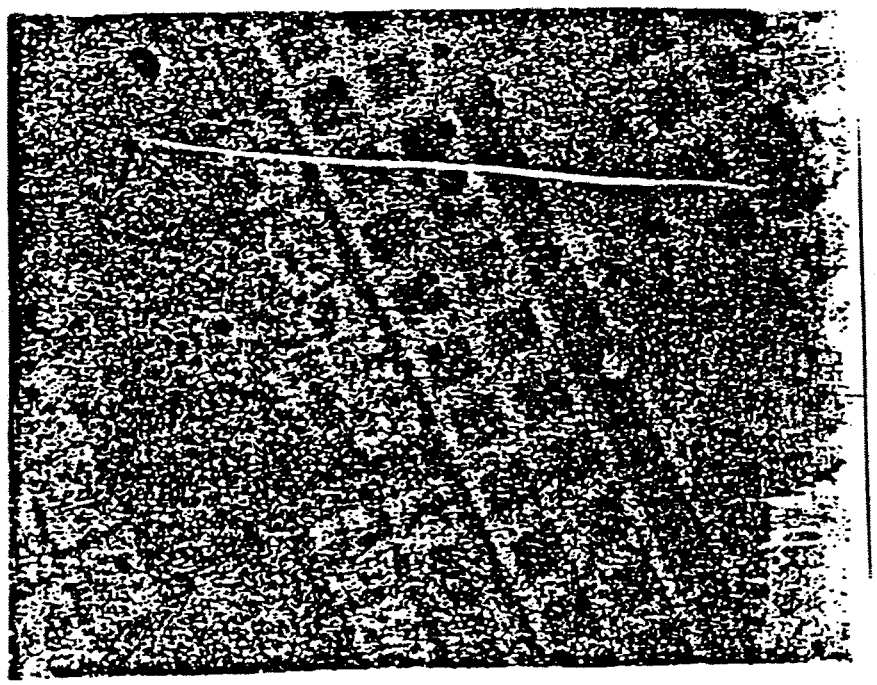
FIG. 5 shows the pattern shown in FIG. 4 developed.

FIG. 5 is photograph of the pattern of FIG. 4 with the parts of the polymer which have not been exposed to radiation removed by exposure to an organic solvent such as, those listed above. Therefore, a negative resist material resulting in conducting lines has been formed.

Figure 10:
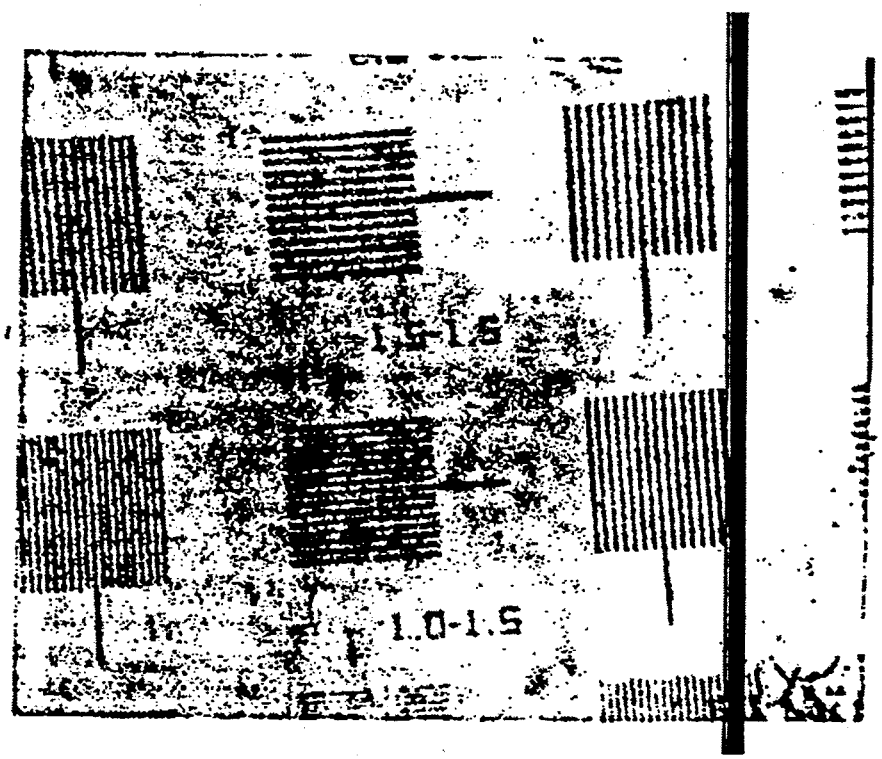
FIG. 10 is a photograph of a polyaniline polymer containing an onium salt after exposure to an electron beam to form conducting live therein shown as the dark pattern.

FIG. 10 shows a photograph of a polyaniline onium salt combination which has been selectively exposed to an electron beam to form conducting line having conductivity of $10^{-2} OHM^{-1} CM^{-1}$, width 0.5 μm and 1.0 μm spacing.

The present invention is applicable to a substituted polythiophene. Polythiophenes have general formula:

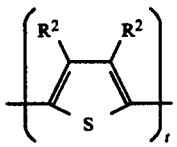

Wherein each $R^2$ is H or any organic or inorganic radical; wherein $t \geq 1$ and whereion at least one $R^2$ is not H.

It is known in the art that conducting forms of polythiophene are soluble in organic solvents such as nitrobenzene, THF—$CH_2Cl_2$—$CH_3CHCl_3$(4;1;1) and in tetrahydronaphthalene. Since these solvents have either a high boiling point or are poisonous, they are unacceptable for a manufacturing environment. It is also know in the art that the polythiophene can be converted to a conducting form upon treatment with a solution of $I_2$, $NOBF_4$, $AsF_5$ and $SbF_5$. These chemicals can corrode electronic components and therefore are unsuitable for electronic applications. Also, the use of these chemicals requires an additional step in the process, first, the polythiophene must be deposited on a substrate and then treated with these chemicals. In contradiction, according to the present invention an onium salt, iodonium salt, a triflate salt, a borate salt, a tosylate salt, a sulfonyloxyimide, or any reagent (referred to herein as a dopant precursor) or oxidizing (a dopant) which dissociates upon exposure to a source of energy to a cationic species is mixed in solution with the polythiophene, deposited on the substrate, dried to remove the solvents and the exposed to either electromagnetic radiation for example, UV radiation an electron beam, or heat, to convert the polymer to the conductive state.

It is believed that the acid generated by the photodecomposition or electron beam decomposition of the onium salt or the sulfonyloxyimide combines with oxygen to oxidize the polythiophene polymer. Polythiophene has a partial conjugated π system. It is believed that the oxidation caused by the decomposed onium salt or the sulfonyloxy imide extends the conjugated π system to induce conductivity in the polythiophene.

Sulfonyloxyimides useful to practice the present invention have the following general formula:

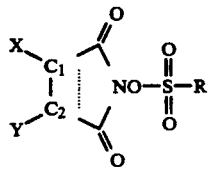

wherein R is selected from the group consisting of —$CF_3$, —$CF_2CF_3$—$CF_2CF_2H$, —$(CF_2)$—$Z_n$ where n=1 to 4, where Z is H, alkyl or aryl.

where m is from 1 to 5, and where X and Y (1) form a cyclic or polycyclic ring which may contain one or more hetero atoms, (2) form a fused aromatic ring, (3) may be independently H, alkyl or aryl, (4) may be attached to another sulfonyoxyimide containing residue or (5) may be attached to a polymeric chain or backbone.

EXAMPLE 2

About 345.6 mg of poly(3-butylthiophene) and 320 mg of triphenyl sulfonium hexafluoroantimonate in 4 mil xylene and 2 ml NMP were mixed on a roller at 56° C. for one hour. The solution was spin-coated on a silicon wafer containing 5000 Å silicon oxide with spin speed 1200 RPM for 10 seconds. The wafer containing this polymer coating was then baked in a convection oven for 30 minutes at 100° C. After baking it was then subjected to deep UV exposure for 30 minutes, the film turned to black color after exposure. The wafer was then further baked on an oven for 2 hours at 100° C. A conductivity of approximately 0.02 S/cm was measured with 4-probe on the film (1.5 μm).

EXAMPLE 3

About 156 mg of 3-methylthiophene-3-butylthiophene-copolymer (PMBT) is 3 mil xylene was mixed on a roller at 56° C. The solution was filtered through a funnel having frit xize 0.9–1.5 μm. Add 117 mg of trifluoromethylsulfonyloxybicyclo (2,2,1)-hept-5-ene,2,3-dicarboximide (MDT) to the solution and mix on roller for 45 minutes. The solution was spin-coated on Si-O2/Si wafer with spin rate 2000 PRM for 30 seconds. The wafer was then subjected to UV exposure for 10 minutes and the hot plate for 1 minute at 89° C. A conductivity of 0.04 S/cm was measured on the polymer (approximately 0.4 μm) using 4-Probe.

EXAMPLE 4

About 600 mg of PMBT was dissolved in a copious amount of xylene (200 ml) then filtered through pressure filter funnel (F frit). The solvent was evaporated and around 5 ml of PMBT in xylene solution was obtained. An amount of 76 mg MDT was added to the solution. The solution was filtered through a 1 μm filter tip using a Gastight syringe. The polymer-MDT was spin-coated on to SiO2/Si wafer and then subjected to UV exposure for 15 minutes. After the wafer was baked on a hot plate for 40 seconds at 90° C., a conductivity of 0.1 S/cm was measured on the polymer using 4-probe.

Examples 2, 3 and 4 can be repeated using an electron beam of about 200 μC/$cm^2$ to about 1 mC/$cm^2$ at about 25 KEV.

Polyparaphenylenevinylenes useful to practice the present invention have general formula wherein each $R^3$ is H or any organic or inorganic radical, and wherein $s \geq 1$. Each $R^3$ can be the same or different:

tice the present invention are represented by the following equations wherein $R^4$, $R^5$ and $R^6$ are as defined above wherein at least two of a, b, c and d are greater than or equal to 1; $m \geq 1$; $Q^1$, $Q^2Q^3$ can be a vinylene group or a direct bond between adjacent constituents:

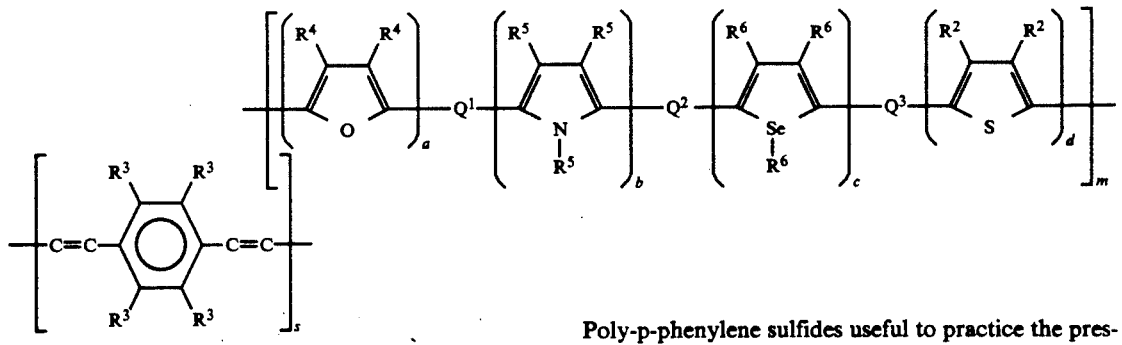

Polyazines useful to practice the present invention have general formula wherein $R^{10}$ is H or an organic or inorganic radical.

wherein $_n$wherein
$n \geq 1$

Polyfurans useful to practice the present invention have general formula, wherein $Z \geq 1$ and each $R^4$ is H or any organic radical, and each $R^4$ can be the same or different;

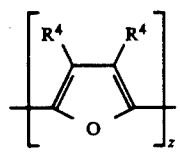

Polypyrroles which are useful to practice the present invention have general formula, wherein $w \geq 1$, each $R^5$ is H or any organic or inorganic radicals; wherein each one $R^5$ can be the same or different;

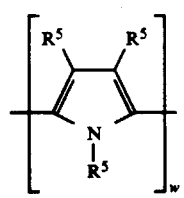

Polyselenophene useful to practice the present invention have general formula, wherein $v \geq 1$, and each $R^6$ is H or any organic or inorganic radical and wherein each $R^5$ can be the same or different;

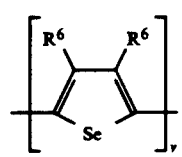

Examples of combinations of polythiophenes, polyfurans, polypyrroles and polyselenophene useful to prac- Poly-p-phenylene sulfides useful to practice the present invention are represented by the following general formula wherein each $R^7$ is H or any organic or inorganic radical and $f \geq 1$, each $R^7$ can be the same or different:

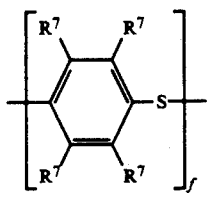

The article entitled "New Routes to Processed Polyacetylenes", T. Swager et al. Polymer Preprints, vol. 30, No. 1, p. 161, April 1989, describes methods of preparing polyacetalyene from a soluble precursor, the teaching of which is incorporated herein by reference. Polyacetalyene is insoluble, therefore, as noted above a conductive resist cannot be made from polyacetalyene directly. The soluble polyacetalyene precursors of Swager et al. can be used in the structures and methods of the present invention to form a solid solution of polyacetalyene and a reagent in which conductivity is induced after exposure to energy. Polyacetalyene can be prepared from a number of precursors by the use of ring opening metathesis polymerization (ROMP). Cyclooctatetraene, a high boiling liquid, can be bulk polymerized to polyacetalyene, In effect, this provides polyacetalyene that can be processed as a viscous liquid. Substituted cyclooactatetranes can be polymerized or co-polymerized to a soluble polymer that can be easily fabricated. Treatment of the polybenzvalene with Lewis acids results in the rearrangement to polyacetalyene.

The polymers of the present invention can be easily spin coated on to a sample and exposed to energy to induce conductivity. The conductive polymers of the present invention can be used as top surface electrical discharge layers or as buried electrical discharge layers for electron beam applications. The conductive polymers according to the present invention are readily etchable in a oxygen plasma. When the polymers of the present invention are used as a buried discharge layer, a first resist layer is deposited on to a substrate, a polymer layer, according to the present invention, is deposited thereover and a second resist layer is deposited on to the polymer layer. The polymer layer can be made conducting by exposure to electromagnetic radiation, an electron beam or heat.

When the conducting polymers according to the present invention are used as a buried discharge layer underneath a dielectric resist layer, the top resist layer still charges up. When exposed to an electron beam the degree of charging depends upon the thickness of this top layer. If the resist material is not too thick charge which accumulates in this top surface layer will leak to the conductive interlayer and flow to ground if the conductive interlayer is grounded. It has been found that the conductive interlayer does not have to be grounded to avoid a distortion of an incident election beam. It is only necessary that the charge leak away quick enough so as not to build up any significant potential at the electron beam target point.

It has been estimated that a surface conductivity of approximately $10^{-6}$ OHM$^{-1}$ is sufficient to avoid distortion of an incident electron beam of approximately 25 Kev with a dose of 15 uC/cm$^2$. It has been found that this surface resistance will maintain the voltage difference between the target point on the top surface resist and a grounded buried conductive layer at a few volts, preferably less than 1.6v, when an electron beam voltage of approximately 20 KEV is used. For 1 micron thick film to achieve a surface conductivity of this value a volume conductivity of about $10^{-2}$ OHM$^1$cm$^{-1}$ is needed. For a 1,000 angstrom thick film a volume conductivity of about $10^{-1}$ OHM$^{-1}$cm$^{-1}$ is needed. We have foundno distortion of an electron beam using 0.4 microns of a conductive discharge layer of a polythiophene having a surface conductivity of approximately $4*10^{-6}$OHM$^{-1}$ under 1 micron of resist even without the discharge layer being grounded. If the resist is grounded we expect a much lower conductivity is required.

The polythiophenes of the present invention have been found to be soluble in toluneanc xylene and a little less soluble in polar solvents for example THF (tetrahdyrofuran), NMP and anisole. Very good mixing has been achieved between the polythiophenes and MDT in xylenes. Enhanced mixing in other solvents may be achievable by incorporating C—O—C linkages or other polar groups as side chains on the thiophene ring of the polymer.

Conductivity of the order of 10 OHM$^{-1}$cm$^{-1}$ can be thermally induced in polymers according to the present invention. The polymeric conductivity is induced thermally by the use of reagents which on heating generate dopants, for example cations. The generated dopants dope the polymer to the metallic regime.

When amine triflates salts are heated they unblock to liberate a free acid, triflic acid, and the volitile amine constituent the temperature at which unblocking occurs depends on the volatility of the amine constituent. The general equation of an amine triflate salt is R$_3$NHCF$_3$SO$_3$. Upon the application of heat the salt unblocks to a free acid represented by chemical formula CF$_3$SO$_3$H and the volatile amine represented by chemical formula R$_3$N. The triflic acid is then capable of protonating the polyaniline as described above. Triflic acid is expected to protonate a polyparaphenylenvinlenes, polyazines, polyfuranes, polypyrroles, polyfurances, polypyrroles, polyselenophene, poly-p-phenylene sulfides and polyacetylenes.

An NMP solution of the non-conducting polyaniline containing either diethyl ammonium trifluoromethane sulphonate or diisopropyl ammonium trifluoromethane sulfonate was spin-coated onto quartz wafers to yield thin films of approximately 2,000 angstroms. The films were placed on a hot plate at a temperature range from about 80° to 90° C. for 3 minutes by which time the films displayed a conductivity on the order or about 1 S/cm.

Other examples of triflate salts useful to practice the present invention which are thermally decomposable to a cationic species which can be used to generate dopants useful to practice the present invention includes the triflates, tosylates and borates of the following list:

$CF_3SO_3H.N(C_6H_5)$
$CF_3SO_3H.NH_3$
$CF_3SO_3H.NH_3$
$CF_3SO_3H.(CH_3)_3N$
$CF_3SO_3H.C_2H_5NH_2$
$CF_3SO_3H.(C_2H_5)_2NH$
$CF_3SO_3H.(C_2H_5)_3N$
$CF_3SO_3H.(i-C_3H_7)_2NH$
$CF_3SsO_3H.(i-C_3H_7)_2N(C_2H_5)$
$CF_3SO_3H.(i-C_3H_7)_2N(C_2H_4OH)$
$CF_3SO_3H.H_2N(C_2H_4OH)$
$CF_3SO_3H.HN(C_4H_4)O$
$CF_3SO_3H.H_2NC(CH_3)_2CH_2H$
$CF_3SO_3H.HN(C_6H_5)$
$CF_3SO_3H.HN(C_2H_4OH)_2$
$BF_3.C_2H_5NH_2$ (0.2M)
$CF_3SO_3(CH_3)_4N$
$H_3C(C_6H_4)SO_3H$ (0.1M)

This list is exemplary only and not limiting.

U.S. patent application Ser. No. 07/322,848 filed on Mar. 14, 1989 to Brunscold et al. entitled "Chemically Amplified Photoresist" the teaching of which is incorporated herein by reference, describes other trifluate compounds.

Since acid combines with oxygen to oxidize polymethylthiophene, thermal decomposition of trifluate salts should dope polythiophene.

It will be recognized by those of skill in the art that the temperature applied and the time of duration of the applied temperature can be adjusted to achieve different values of conductivity. Any thermally decomposing species which generates a cation or oxide species can be used to thermally induce conductivity in the polymers of the present invention.

The electrically conducting polymers of the present invention have particular usefulness in electron microscopy. Electron microscopy is currently used in microelectronics to make observations and dimensional measurements on dielectric masks, for example, quarts/chrome masks in optical lithography. Charging is caused by the incident electron beam. The current solution to avoid the charging problem is to deposit a thin layer of metal onto the mask. This is, however, a destructive method since complete removal of the metal layer is quite difficult if not impossible. Therefore, scanning electron microscopic observations and measurements are limited to scrapped pieces. Since the conducting polymers of the present invention are readily removable, for example by an oxygen plasma or by undoping in a base, for example, in 0.1M NH$_4$OH and dissolving off in a solvent, for example, NMP, they can be used as a discharge layer in SEM applications. Since the conductive polymers of the present invention are removable, they can be used as a discharge layer on the surface of masks, electronic devices such as semiconductor chips and semiconductor chip packaging substrates which are not scrap pieces.

Figure 6:
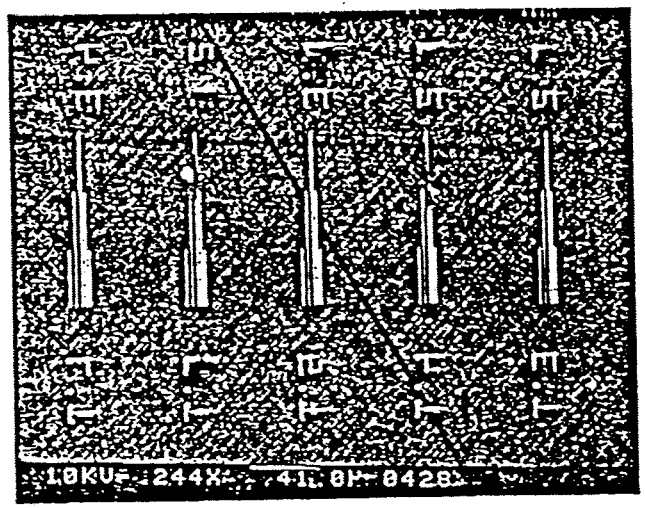
FIG. 6 shows a low resolution SEM of a dielectric mask.
Figure 7:
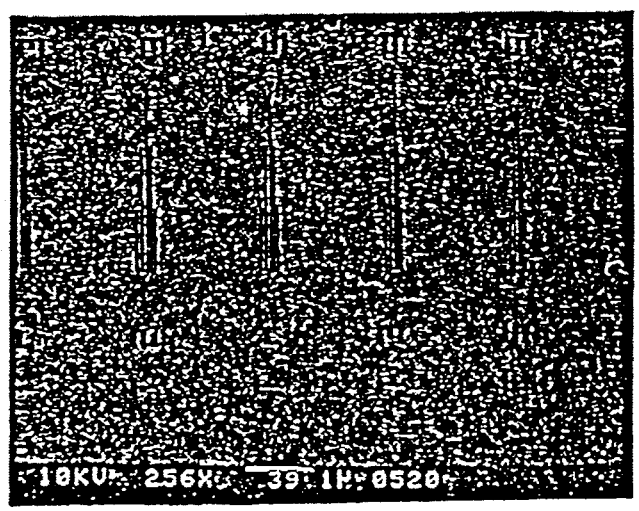
FIG. 7 shows a low resolution SEM of the mask of FIG. 6 after the mask has been coated with a conductive polyaniline material.
Figure 8:
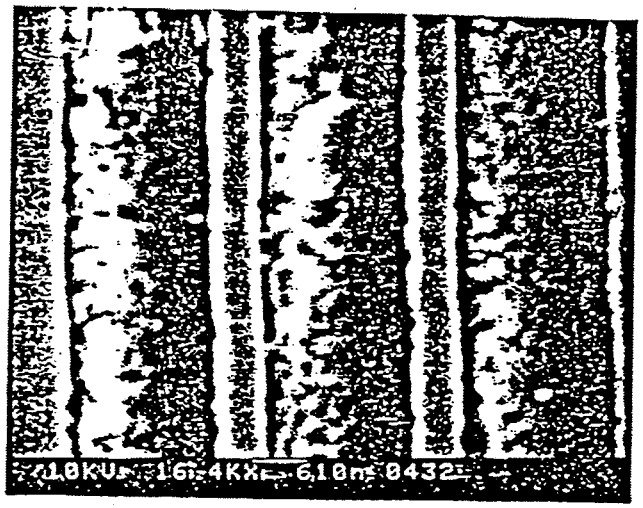
FIG. 8 is a high resolution SEM dielectric mask.
Figure 9:
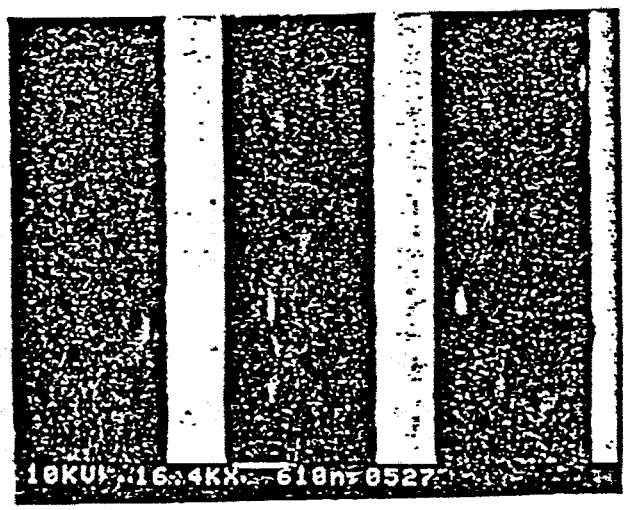
FIG. 9 is a high resolution SEM of the mask of FIG. 8 coated with an electrically conducting polyaniline material.

Any of the conducting polymers according to the present invention can be used as a discharge layer to avoid distortion in electron beam microscopis observations. For example, a quartz/chromium mask was observed with a SEM at 10 KV at various resolutions. The same mask was coated with an NMP solution of polyaniline which was doped with 1N HCl to result in a conductivity of abut 1 S/cm. The coated mask was heated to a temperature of about 80° C. to drive off the solvent. The resulting film thickness was about 1,000 angstroms. The polyaniline coated mask was observed with a SEM. FIG. 6 shows a 256 SEM of a bare quartz/chrome mask. FIG. 7 shows a low resolution SEM of the same mask with a polyaniline coating. FIG. 8 shows a high resolution SEM of a bare mask. FIG. 9 shows a 16.4 KV. SEM of the mask with a polyaniline coating. As can be readily seen from the FIGS. 6–9, the masks which are coated with the conductive polyaniline have a substantially higher resolution than the uncoated mask.

Quite surprisingly it has been found that the minimum surface conductivity of the conductive polymer to avoid resolution distortion due to charging of the observed substrate is about $10-6$ OHM$^{-1}$. Charging was not observed at 10 kv for a conducting polyaniline. Without the conductive coating charging is observed above 2 kv. It is quite surprising that materials having conductivities less than less than that of metals can act as a discharge layer when they are grounded or not grounded.

For image enhancement in a scanning electron microscope or the like conducting polymers can be made either by techniques known in the art or by techniques described herein. As described above a solution of proton donor such as HCl and an emeraldine base form of a polyaniline can be mixed in solution which creates a conductive polymer. The solution can be disposed on the sample to be observed under an electron beam. The solvent can be driven off by the application of heat to form an electrically conductive polymer layer. Alternatively, the polymers fabricated according to the present invention can be used. The coated sample can either by exposed to heat or radiation to induce conductivity in the polymer or in the case of the electron beam sensitive cationic species, the electron beam used to make the SEM observation can induce the electrical conductivity in the polymer coating.

After SEM observation the polymer coating can be removed for example using a plasma etch, such as an oxygen plasma or in the cae of a polyaniline doped with HCl the conductive polymer can be removed by a wash for example a base, such as KOH, followed by an organic solvent, such as NMP.

The electrically conductive polymer materials of the present invention and other electrically conductive polymers have additional uses such as an electromagnetic interference (EMI) coating on a dielectric surface. For example, electrical components are frequently contained within dielectric housings such as cabinets, molded plastics and the like. To reduce the susceptibility of the electronic components contained within the housing, the dielectric housing can be coated with the polymeric materials of the present invention. This EMI technique is easily implemented in a high volume manufacturing line had has a very low cost. Continual EMI coatings contain expensive precious metals such as silver embedded in a polymer matrix.

In summary electrically conductive resist structures and materials have been described which act as their own electrostatic discharge layers. The electrical conductivity can be induced in the polymers of the present invention by exposure to sources of energy such as electromagnetic radiation, an electron beam and heat. The polymers according to the present invention contain $\pi$ conjugated systems which are extended by exposing to such as dopants a cationic species. The preferred polymers are selected from the group of substituted and unsubstituted polyanilines, polyparaphenylenvinyles, polythiophenes, poly-p-phenylene sulfides, polyfuranes, polypyrroles, polyselenophene, polyacetylenes formed from soluble precursors, combinations thereof and combinations thereof with other materials blends thereof with other polymers and polymers thereof formed from soluble precursors. The polymers can be selectively doped. The polymers are useful as buried and surface electrical discharge layers for electron beam lithography applications and for discharge layers for electron microscopy applications for example, scanning electron microscopy.

It is to be understood that the above described embodiments are simply illustrative of the principles of the invention various other modifications and changes may be derived by those of skill in the art which will embody the principles of the invention and fall within the spirit and scope thereof.

Having thus described the invention, we claim as new and desired to secure by Letters of Patent:

1. A structure comprising:
   a substrate having a surface;
   at least a part said substrate being a dielectric body housing an electronic device;
   said solid solution containing materials selected from the group consisting of a substituted and unsubstituted polyparaphenylenevinylenes, polyanilines, polyazines, polythiophenes, poly-p-phenylene sulfides, polyfuranes, polypyrroles, polyselenophene, polyacetylenes formed from soluble precursors and combinations thereof and containing a dissociated doping precursor selected from the group consisting of onion salts, iodonium salts, triflate salts, borate salts and tosylate salts and sulfonyloximides;

2. The structure of claim 1, further including a first resist material disposed between said surface and said solid solution.

3. The structure of claim 1 further including a resist material disposed over said solid solution.

4. The structure of claim 1 wherein said substrate is a plastic.

5. The structure of claim 1, wherein said solid solution provides electromagnetic shielding.

6. The structure of claim 1, wherein said solid solution provides electromagnetic discharge properties to said surface.

7. The structure of claim 1, wherein said solution has a conductivity greater than about $10^{-6}$ OHM$^{-1}$.

8. The structure of claim 1 wherein said surface is a dielectric surface.

9. The structure of claim 1, wherein said electronic device is an integrated circuit.

* * * * *